United States Patent [19]
Ueno

[11] Patent Number: 5,882,433
[45] Date of Patent: Mar. 16, 1999

[54] SPIN CLEANING METHOD

[75] Inventor: Kinya Ueno, Nirasaki, Japan

[73] Assignee: Tokyo Electron Limited, Tokyo, Japan

[21] Appl. No.: 650,998

[22] Filed: May 21, 1996

[30]     Foreign Application Priority Data

May 23, 1995  [JP]  Japan ..................................... 7-148061

[51] Int. Cl.⁶ ...................................................... B08B 3/10
[52] U.S. Cl. ................................................. 134/31; 134/33
[58] Field of Search .................................. 134/31, 32, 33

[56]              References Cited

U.S. PATENT DOCUMENTS

| | | | |
|---|---|---|---|
| 5,271,774 | 12/1993 | Leenaars et al. | 134/31 |
| 5,660,642 | 8/1997 | Britten | 134/31 |
| 5,715,612 | 2/1998 | Schwenkler | 34/470 |

FOREIGN PATENT DOCUMENTS

| | | |
|---|---|---|
| 62-188323 | 8/1987 | Japan . |
| 5-243205 | 9/1993 | Japan . |
| 6275596 | 9/1994 | Japan . |

*Primary Examiner*—Jeffrey Snay
*Attorney, Agent, or Firm*—Oblon, Spivak, McClelland, Maier & Neustadt, P.C.

[57]              ABSTRACT

At first, a semiconductor wafer is held and rotated by a spin chuck, and supplied with a hydrofluoric acid solution from a chemical liquid nozzle to remove natural oxide films on the wafer. Then, the wafer is supplied with pure water for rinsing it from a rinsing nozzle while the wafer is rotated. Right before the pure water stops being supplied, the wafer is supplied with an IPA liquid from a replacing medium nozzle while the wafer is rotated. The pure water is replaced with the IPA liquid by means of the Marangoni effect and a centrifugal force. Then, the wafer is rotated at 300 rpm for one second, at 3000 rpm for four seconds, and at 5000 rpm for five seconds, in this order, to remove the IPA liquid by means of a centrifugal force.

23 Claims, 8 Drawing Sheets

SPIN CLEANING METHOD

BACKGROUND OF THE INVENTION

1. Field of the Invention

The present invention relates to a spin cleaning method of cleaning a substrate to be treated, such as a semiconductor wafer or an LCD substrate.

2. Description of the Related Art

A process for manufacturing a semiconductor device or a liquid crystal display device (LCD) generally includes a step of cleaning a substrate to be treated, such as a semiconductor wafer or an LCD substrate. The cleaning step is intended to remove particles adhered to the surface of the substrate and a natural oxide film which has been formed by exposing the substrate to the atmosphere. As an apparatus for carrying out the cleaning step, there are a batch type in which a lot of substrates are treated in a process chamber at the same time and a singular type in which substrates are treated in a process chamber one by one. A cleaning apparatus of the singular type generally. utilizes a spin cleaning method.

In the spin cleaning method, a substrate to be treated is held and rotated by a spin chuck. The surface of the substrate is supplied with a chemical liquid and then with pure water used as a rinsing liquid, and is sequentially subjected to a spin drying operation. In addition to make the pure water spun off by a centrifugal force, an inactive gas or clean air may be sprayed onto the surface of the substrate to facilitate the spin drying operation, when the substrate is dried.

Figure 12A:
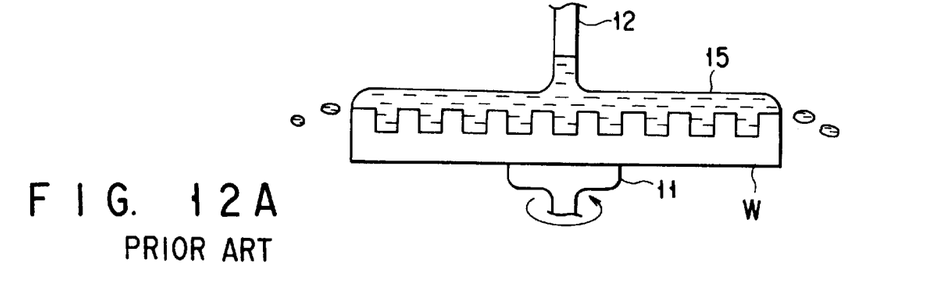
FIGS. 12A to 12D are views showing a conventional cleaning method in its order.
Figure 12B:
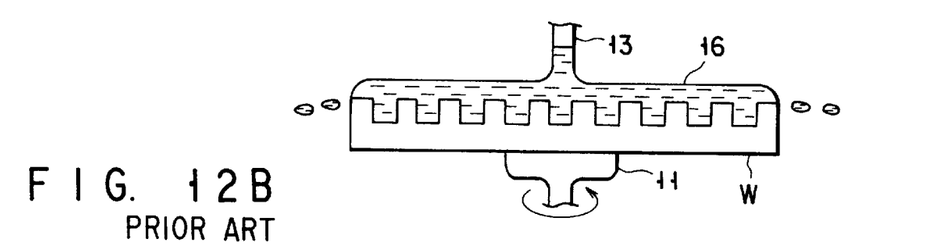
Figure 12C:
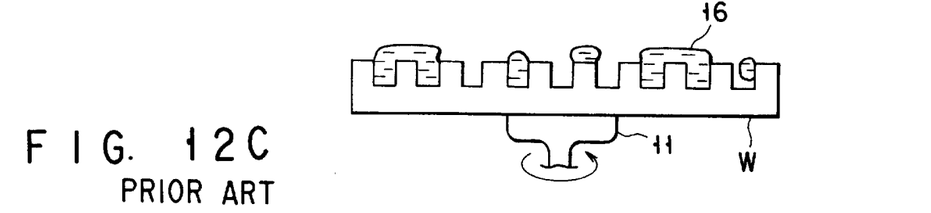
Figure 12D:
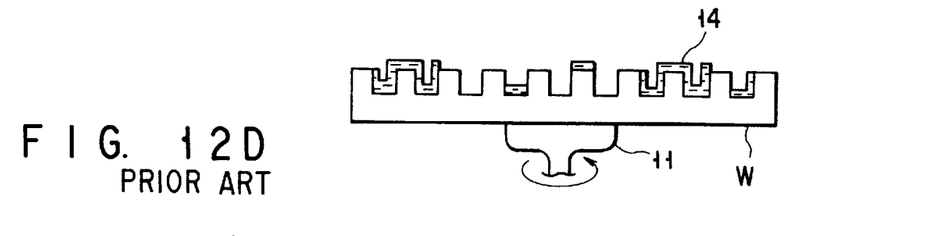
Figure 13A:
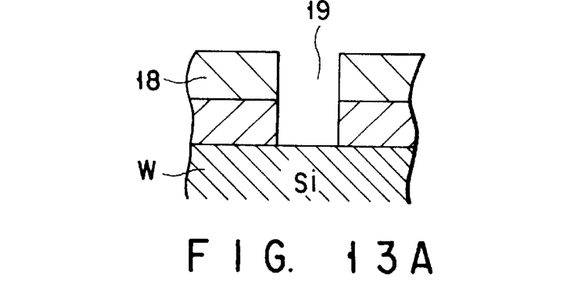
FIGS. 13A and 13B are views showing examples of the surface structure of a wafer to be cleaned.
Figure 13B:
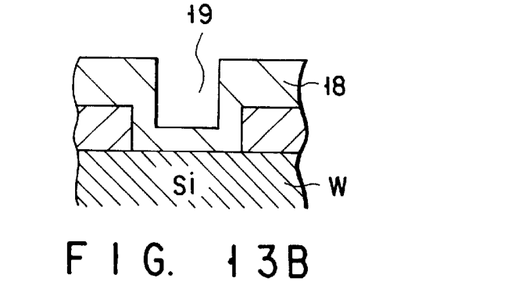

A trace of the rinsing liquid, so called "water mark", left on the substrate when dried, is used to evaluate a cleaning state of the substrate. FIGS. 12A to 12D are views schematically showing a manner of a water mark being formed on the surface of, e.g, a semiconductor wafer W, when the surface of the wafer is treated with hydrofluoric acid. At first, as shown in FIG. 12A, a hydrofluoric acid solution 15 is supplied onto the surface of the wafer W while the wafer W is held and rotated by a chuck 11. Then, as shown in FIG. 12B, pure water 16 is supplied from a nozzle 13 to rinse the surface of the wafer W while the pure water is spun off by a centrifugal force. During this step, part of the pure water is left on the surface of the wafer, as shown in FIG. 12C. As a result, a water mark 14 is formed to correspond to the left part of the pure water 16, as shown in FIG. 12D.

It is thought that the water mark is generated as follows. That is, a very small amount of silica ($SiO_2$) is originally contained in the pure water. Further, $H_2SiO_3$ is produced by reaction among water, oxygen in air, and silicon of the wafer, as shown in reaction formula (1).

$$Si+H_2O+O_2 \rightarrow H_2SiO_3 \tag{1}$$

As a result, a very small amount of $SiO_2$ and $H_2SiO_3$ is contained in the pure water used as the rinsing liquid. On the other hand, while the pure water is being dried on the surface of the wafer, the pure water is divided into a plurality of portions and contracted due to its surface tension. The impurities, $SiO_2$ and $H_2SiO_3$, contained in the pure water are gathered with the pure water being dried, and precipitated as particles on the surface of the wafer, thereby forming water marks.

Especially in the hydrofluoric acid treatment, $SiO_2$ on the surface of the wafer W is removed and Si is exposed, so that the reaction as shown in the reaction formula (1) easily occurs. Further, where a hydrophobic film 18, such as polysilicon, is deposited and a recess 19 is formed on the surface of the wafer W, hardly any of the pure water is spun off so that water marks are apt to be left.

As described above, water marks are formed of impurity particles. With a decrease in the line width of a semiconductor device, a more strict administration is required in relation to particle contamination. As a result, it has been deemed necessary to prevent water marks from being formed.

Jpn. Pat. Appln. KOKAI Publication No. 5-243205 discloses a method of removing a liquid from a substrate surface in a centrifugal machine. In this method, an organic solvent vapor is supplied onto the substrate, which is held by a spin chuck with a vacuum force and is preferably non-rotated, so that the liquid on the substrate is contracted by means of the Marangoni effect. Then the substrate is rotated so that the liquid is removed from the substrate. The organic solvent vapor is supplied in a non-saturated state and at a temperature lower than that of the substrate, so that the organic solvent is prevented from being condensed on the substrate.

In this method, however, it is necessary to make improvements in terms of temperature administration of the organic solvent vapor and safety. Further, there is a problem in that the organic solvent vapor is hardly diffused in a uniform state. Still further, where a so-called spin chuck of the mechanical type, in which a wafer is fixed to the chuck by clamp fingers, is used, water marks are possibly formed at the portions engaged with the clamp fingers.

SUMMARY OF THE INVENTION

Therefore, an object of the present invention is to provide a spin cleaning method in which the rate of generating water marks is low.

According to a first aspect of the present invention, there is provided a spin cleaning method comprising:

a rinsing step of supplying a rinsing liquid onto a surface of a substrate to be treated while rotating the substrate;

a replacing step of supplying a replacing medium liquid onto a substantial center of the surface of the substrate from above, and replacing the rinsing liquid with the replacing medium liquid on the surface of the substrate, the replacing medium liquid being mixable with the rinsing liquid and having a degree of surface tension lower than that of the rinsing liquid; and a removing step of removing the replacing liquid on the surface of the substrate by a centrifugal force which is generated by rotating the substrate.

According to a second aspect of the present invention, there is provided a spin cleaning method comprising:

a rinsing step of supplying a rinsing liquid onto a surface of a substrate to be treated while rotating the substrate;

a replacing step of supplying a replacing medium vapor onto a substantial center of the surface of the substrate from above, and replacing the rinsing liquid with the replacing medium vapor on the surface of the substrate, the replacing medium vapor being mixable with the rinsing liquid and having a degree of surface tension lower than that of the rinsing liquid; and a removing step of removing the replacing liquid on the surface of the substrate by a centrifugal force which is generated by rotating the substrate, wherein the rinsing liquid has a temperature higher than 20° C., and the replacing medium vapor has a temperature higher than that of the rinsing liquid, when the rinsing liquid and replacing medium are supplied.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
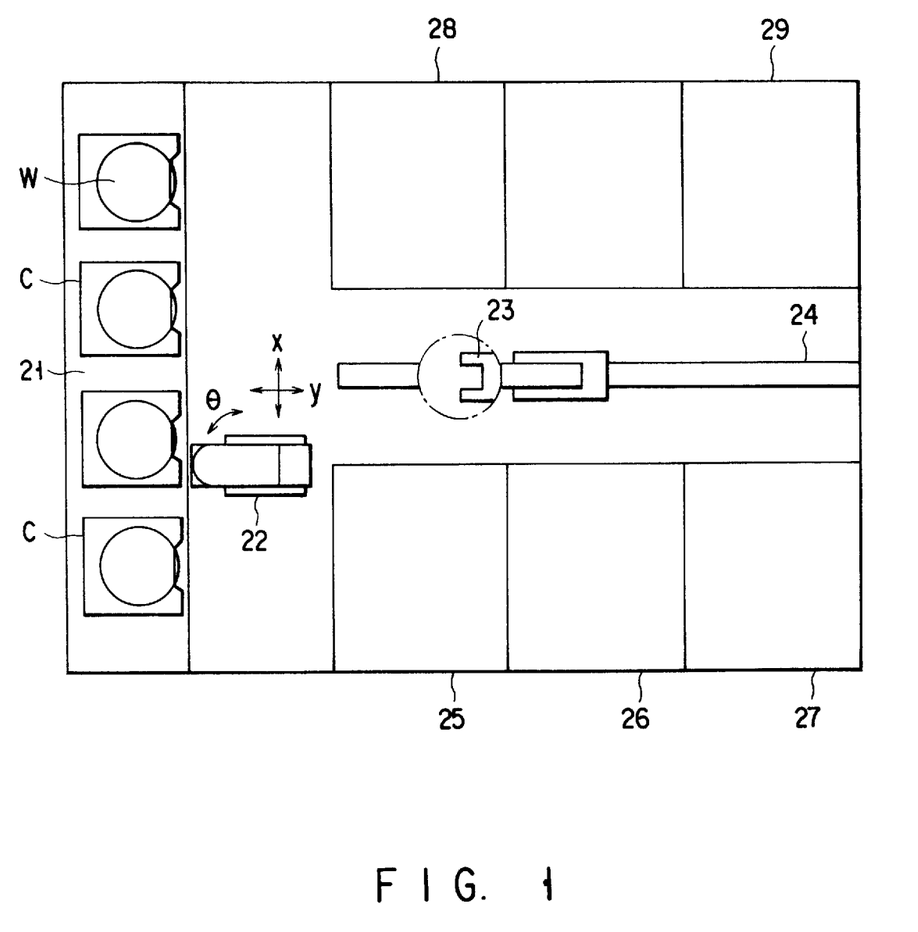
FIG. 1 is a plan view schematically showing a cleaning system.

FIG. 1 is a plan view schematically showing a cleaning system which is provided with a cleaning apparatus according to an embodiment of the present invention.

The cleaning system has an in/out port 21 to and from which cassettes each containing, e.g., 25 wafers W are transferred from and to the outside. In order to transfer the wafers W, a transfer arm 22 movable in X, Y and θ directions and a main arm 23 movable in X, Y, θ and Z, i.e., vertical, directions are arranged. A backside cleaning section 25, a finishing section 26, an APM treatment section 27, an HPM treatment section 28, and a hydrofluoric acid treatment section 29 are arranged along a transfer path 24 of the main arm 23.

The wafers contained in the cassettes C transferred into the in/out port 21 are taken out by the transfer arm 22, and then received by the main arm 23 and transferred to the treatment sections 25 to 29. For example, a wafer W is processed in the following order.

At first, the backside of the wafer W is cleaned by, e.g., pure water in the backside cleaning section 25. Then, the wafer W is treated with an APM solution (mixture of ammonia, hydrogen peroxide, and pure water) in the APM treatment section 27, so that particles on the wafer W are removed. Then, the wafer W is treated with an HPM solution (mixture of hydrochloric acid, hydrogen peroxide, and pure water) in the HPM treatment section 28, so that metallic contaminants on the wafer W are removed. Then, the wafer W is treated with a hydrofluoric acid solution in the hydrofluoric acid treatment section 29, so that natural oxide films on the wafer W are removed. At last, the wafer W is washed with pure water and is dried in the finishing section 26.

Figure 2:
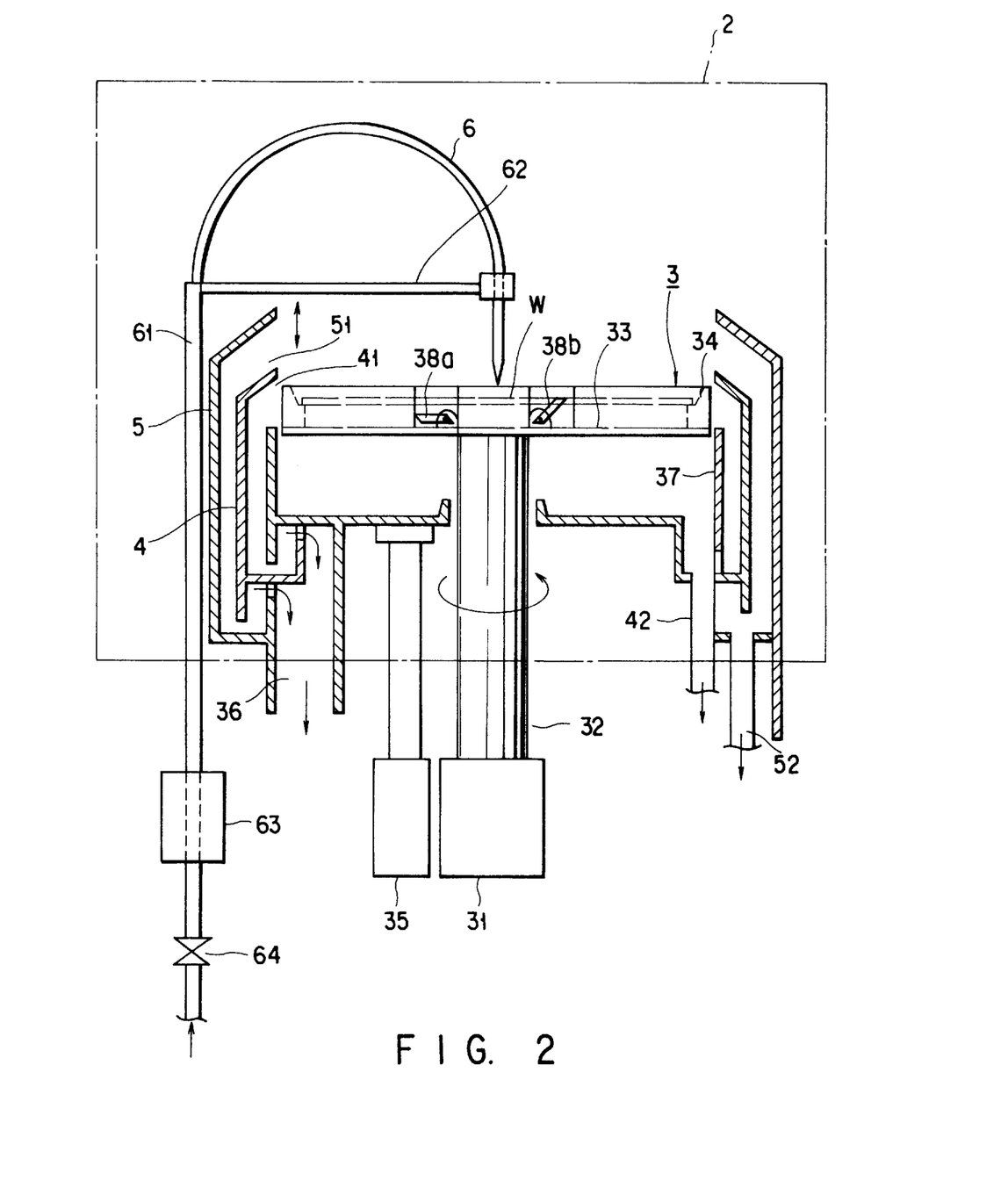
FIG. 2 is a partially sectional side view of a main part of a cleaning apparatus according to an embodiment of the present invention.
Figure 3:
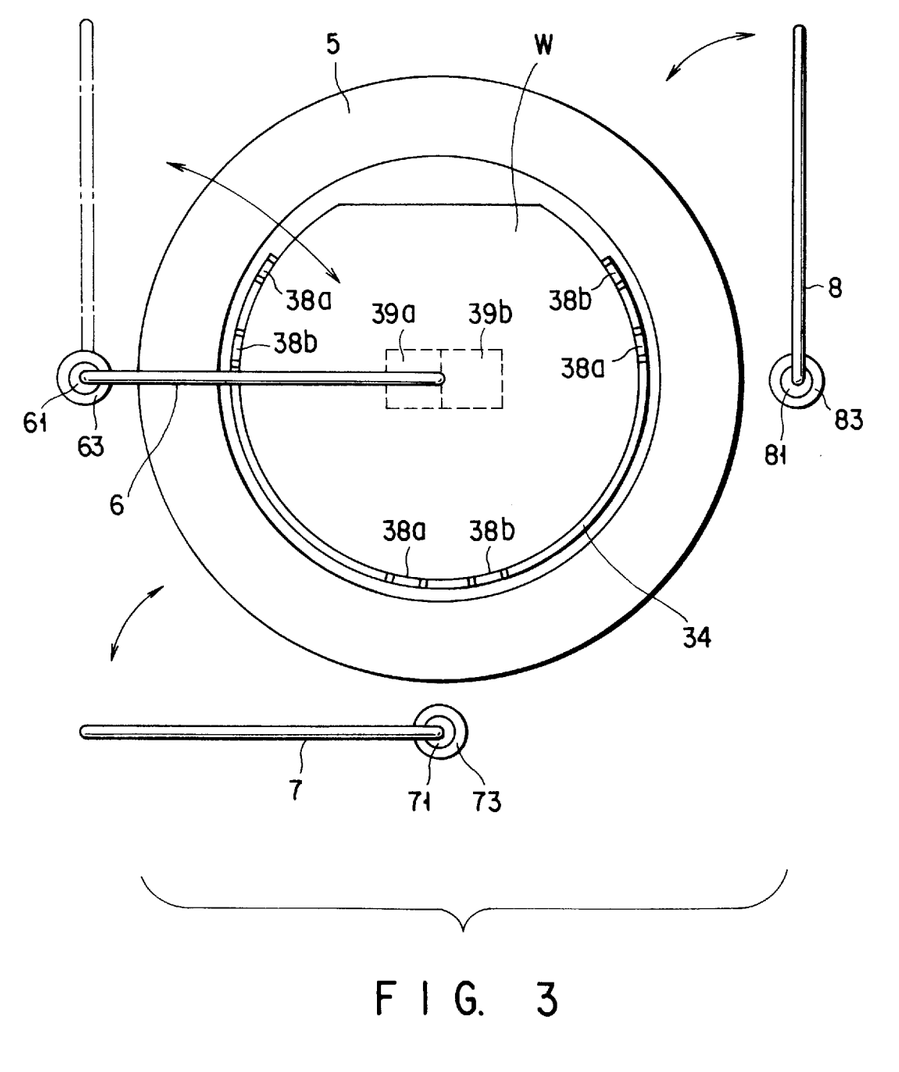
FIG. 3 is a plan view showing a main part of the cleaning apparatus shown in FIG. 2.

In the APM treatment section 27, HPM treatment section 28, hydrofluoric acid treatment section 29, and the finishing section 26, the wafer W is subjected to a rinsing treatment, and rinsing liquid removal. The structure of a cleaning apparatus according to this embodiment of the present invention is applied to any one of these treatment sections 27, 28, and 29. However, the cleaning apparatus according to this embodiment will be exemplified by the hydrofluoric acid treatment section 29, in which the advantages of the present invention become prominent. FIGS. 2 and 3 are partially sectional side view and plan view, respectively, of a main part of the cleaning apparatus, i.e., hydrofluoric acid treatment section 29.

The cleaning apparatus 29 has an airtight processing chamber 2 which is adjustable to a reduced atmosphere. A spin chuck 3 for holding and rotating the wafer W in a horizontal plane is arranged in the processing chamber 2. The spin chuck 3 has a rotation plate 33 fixed to the top of a rotation shaft 32 which is rotated about a vertical axis by a rotation mechanism 31 including a motor or the like. A mount ring 34 is arranged along the edge of the rotation plate 33 so as to support the edge of the wafer W such that the wafer W is placed above the rotation plate 33 with a gap therebetween. As shown in FIG. 3, part of the mount ring 34 is cut out, so that the wafer W is transferred between the main arm 23 and the mount ring 34.

Clamp fingers 38a and 38b are arranged along the mount ring 34 at six portions. Each of the clamp fingers 38a and 38b are movable between a clamp position where it engages with the side or edge of the wafer W to fix the wafer W, and a retreat position where it is retreated under the supporting level of the mount ring 34. The three clamp fingers 38a constitute one group for cooperating and fixing the wafer W, while the other three clamp fingers 38b constitute another group for cooperating and fixing the wafer W. The clamp fingers 38a are driven by a driver 39a supported by the rotation plate 33 while the clamp fingers 38b are driven by a driver 39b supported by the rotation plate 33. As described later, the clamp fingers 38a and clamp fingers 38b are switched from one group to the other during a spin drying operation of the wafer W.

A double cup structure including an inner cup 4 and an outer cup 5 surrounds the spin chuck 3. The double cup structure is moved in a vertical direction by an elevator 35. The inner and outer cups 4 and 5 are used for receiving and draining a liquid scattered by rotation of the wafer W. The outer cup 5 has a receiving opening 51 located above a receiving opening 41 of the inner cup 4.

A common gas exhausting path 36 is arranged under the inner and outer cups 4 and 5 so as to exhaust gas in the cups 4 and 5. Drain pipes 42 and 52 independent of each other are connected to the inner and outer cups 4 and 5, respectively, at their bottoms. Another receiving cup 37 is arranged inside the inner cup 4 to surround the lower part of the spin chuck 3. Liquid stored in the receiving cup 37 is removed through the drain pipe 42 of the inner cup 4. With this double cup structure, a chemical liquid and a rinsing liquid can be collected separately.

The cleaning apparatus 29 has a chemical liquid nozzle 6, a rinsing nozzle 7, and replacing medium nozzle 8. The chemical liquid nozzle 6 is used for supplying a hydrofluoric acid solution of, e.g., 0.5%, onto the surface of the wafer W. The rinsing nozzle 7 is used for supplying a rinsing liquid, such as pure water, onto the surface of the wafer W. The replacing medium nozzle 8 is used for supplying a replacing medium, such as an organic solvent, e.g., isopropyl alcohol (IPA), onto the surface of the wafer W.

It is preferable for the replacing medium to be mixable with the rinsing liquid, to have surface tension a degree lower than that of the rinsing liquid, and to be volatile, e.g., with a vapor pressure of 10 mmHg to 200 mmHg at 20° C. Where the rinsing liquid consists essentially of pure water or has properties similar to pure water, a hydrophilic substance, such as IPA, acetone, or methanol, can be used as the replacing medium.

Each of the nozzles 6, 7, and 8 has a proximal portion inserted in a rotation shaft 61, 71, or 81, and a distal portion extending out of the top of the rotation shaft 61, 71, or 81, and bent facing and in close proximity of the center of the wafer W. The distal portion of each nozzle 6, 7, or 8 is fixed to an arm 62, 72, or 82 horizontally extending from the rotation shaft 61, 71, or 81. The rotation shafts 61, 71, and 81 are arranged vertical, around the double cup structure at intervals in an angular direction.

Each of the rotation shafts 61, 71, and 81 is rotated around a vertical axis by a rotation mechanism 63, 73, or 83. By this rotation, each of the nozzles 6, 7, and 8 is swingable between a supply position where its tip faces a portion near the center of the wafer W, and a retreat position where its distal portion is placed outside the outer cup 5. The rinsing nozzle 7 and replacing medium nozzle 8 are placed on their supply positions at a time during a treatment. For this reason, upon being placed on the supply positions, the tip of the nozzle 7 is located a little distant from the center of the wafer W, and extended in a slanted portion so as to supply pure water, onto the center of the wafer W, while the tip of the nozzle 8 is located above the center of the wafer W, as shown in FIG. 4.

Figure 4:
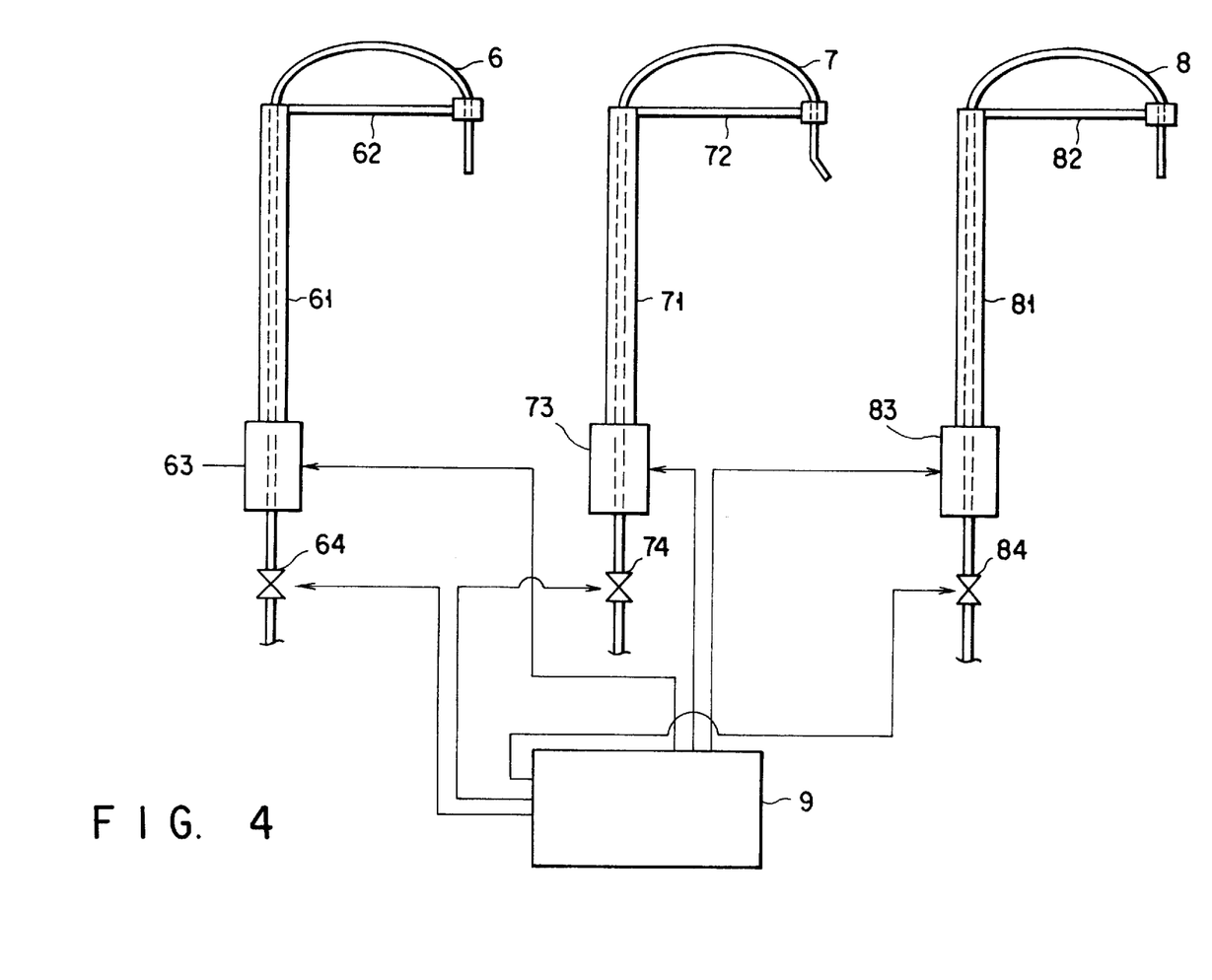
FIG. 4 is a diagram showing the nozzles and control section of the cleaning apparatus shown in FIG. 2.

The proximal portions of the nozzles 6, 7, and 8 are connected to hydrofluoric acid, pure water, and IPA sources (not shown), respectively, through valves 64, 74, and 84, respectively, as shown in FIG. 4. The cleaning apparatus further has a control section 9. The control section 9 controls the rotation mechanisms 63, 73, and 83, and the valves 64, 74, and 84, in accordance with a predetermined program stored in a memory in advance.

A spin cleaning method in the cleaning apparatus 29 will be described, in a case where pure water and an IPA liquid are used as the rinsing liquid and replacing medium, respectively.

At first, a wafer W is placed on the mount ring 34 of the spin chuck 3 by the main arm 23 shown in FIG. 1. Then the wafer W is held by the clamp fingers 38a and rotated at, e.g., 300 rpm by the rotation mechanism 31 of the spin chuck 3.

Figure 5A:
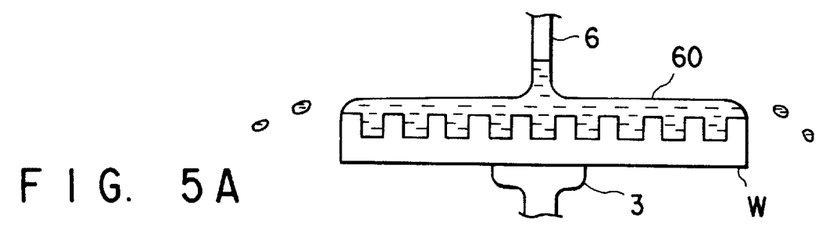
FIGS. 5A to 5D are views showing a cleaning method of the present invention in its order.

The nozzle 6 is swung from the retreat position to the supply position where the tip faces the center of the wafer W. The valve 64 is opened and a hydrofluoric acid solution 60 of, e.g., 0.5% is supplied from the nozzle 6 onto the surface of the wafer W near its center, as shown in FIG. 5A, so that natural oxide films on the surface of the wafer W are removed. The hydrofluoric acid solution 60 is supplied, e.g, at 1000 ml/min for one minute.

During this operation, the double cup structure is set such that the receiving opening 41 of the inner cup 4 faces the edge of the wafer W, as shown in FIG. 2. While the exhausting path 36 is exhausted by exhausting means (not shown), the hydrofluoric acid solution spun off the surface of the wafer W is sucked by the inner cup 4 through the receiving opening 41, and is collected through the drain pipe 42.

Figure 5B:
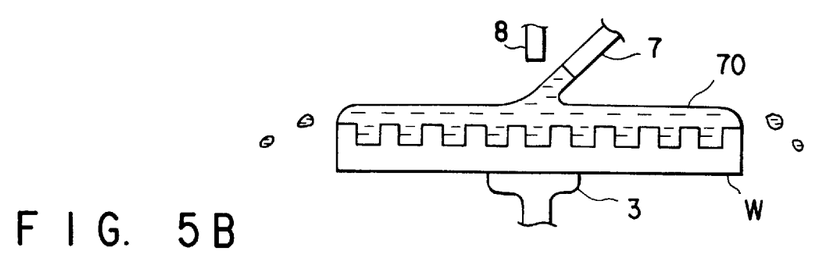

Then, the chemical liquid nozzle 6 is retreated, and the rinsing nozzle 7 and replacing medium nozzle 8 are swung to their supply positions where their tips face the center of the wafer W. The valve 74 is opened and a rinsing liquid, such as pure water 70 is supplied from the nozzle 7 onto the surface of the wafer W near its center, as shown in FIG. 5B, so that the surface of the wafer is rinsed. The pure water 70 is supplied, e.g, at 1000 ml/min for one minute.

During this operation, the double cup structure is set such that the receiving opening 51 of the outer cup 5 faces the edge of the wafer W. The pure water spun off the surface of the wafer W is sucked by the outer cup 5 through the receiving opening 51, and is collected through the drain pipe 52.

Figure 5C:
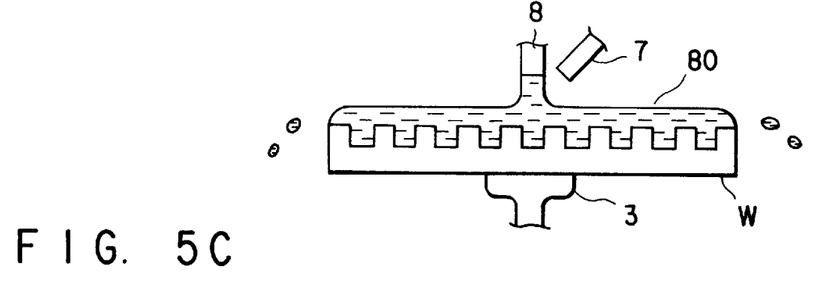

Before the supply of the pure water 70 is stopped, i.e., the valve 74 is closed, such as two or three seconds before that, the valve 84 is opened and an IPA liquid 80 used as the replacing medium is supplied from the nozzle 8 onto the surface of the wafer W near its center, as shown in FIG. 5C, so that the rinsing liquid is replaced. The IPA liquid 80 is supplied, e.g, at 500 ml/min for ten seconds.

Figure 5D:
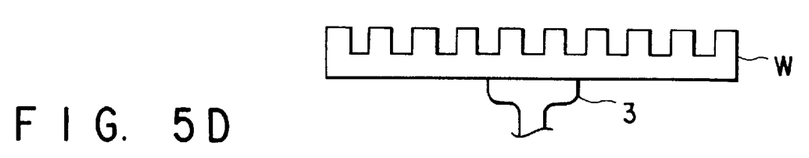

The wafer W is rotated at 300 rpm during the supply of the hydrofluoric acid solution, pure water, and IPA liquid. After the supply of the IPA liquid is stopped, the wafer W is rotated, e.g., at 300 rpm for one second, then at 3000 rpm for four seconds, and then at 5000 rpm for five seconds. By doing so, the IPA liquid is removed, as shown in FIG. 5D. These sequential operations are conducted on the basis of a program stored in the control section 9.

It is preferable that wafer clamping is switched from the clamp fingers 38a to the clamp fingers 38b during a high speed rotation of 3000 rpm to 5000 rpm. With this operation, fluids are removed at those portions of the wafer W which correspond to the clamp fingers 38a and water marks are hardly formed there. The pressure of the processing chamber 2 may be reduced to a vacuum, preferably to a vapor pressure of the replacing medium at the temperature of the wafer W (60 mmHg at 30° C. for IPA), after the pure water 70 is replaced by the IPA liquid 80. An inactive gas, such as $N_2$, may be sprayed onto the surface of the wafer W during the spin drying operation. With these auxiliary operations, the replacing medium can be removed for a shorter period of time.

In the cleaning method described above, the IPA liquid is supplied onto the surface of the wafer W after the pure water is supplied, and thus is dissolved in the pure water on the wafer W. Since IPA has a surface tension smaller than that of pure water and easily wets an underlayer, the pure water is completely replaced by the IPA liquid. Then, the replacing IPA liquid is removed by a centrifugal force. By doing so, the pure water is rapidly removed from the surface of the wafer W. As a result, it is possible to prevent water marks from being formed by precipitation of a product produced by a reaction among water, oxygen in the air, and silicon, or by precipitation of silica contained in the pure water. It follows that particles are less generated to result in an increase in yield. It should be noted that IPA essentially contains no impurities. However, even if the IPA liquid contains a very small amount of impurities, the IPA liquid is removed by a centrifugal force so that a possibility of generating water marks is low.

Where a certain period of time is set between the time of stopping the supply of the pure water and the time of starting the supply of the IPA liquid, water drops are formed to increase the generation rate of water marks. For this reason, the pure water and IPA liquid are preferably supplied in a time-overlapping manner. However, supply of the IPA liquid may be started when supply of the pure water is stopped, without any blank period of time therebetween, so that a short cleaning period of time is attained.

A common nozzle may be used for supplying both the pure water and IPA liquid. In this case, no blank period of time is set by opening a valve of an IPA path before closing a valve of a pure water path.

Dry air or $N_2$ gas may be sprayed onto the surface of the wafer W along with the supply of the IPA liquid or spin drying operation. By doing so, occurrence of water marks is controlled and removal of the IPA liquid is accelerated.

Figure 6A:
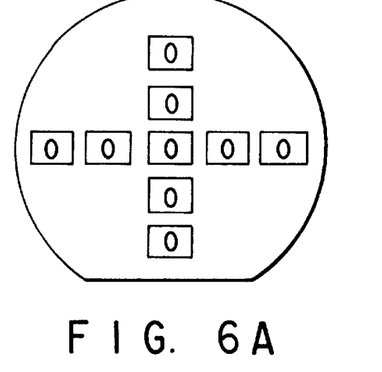
FIGS. 6A to 6C are views showing evaluation results of cleaned states in an example of the present invention and comparative examples.

Under the conditions (flow rates, supply times, wafer rotation speeds, and the like) set out with reference to FIGS. 5A to 5D, the hydrofluoric acid solution, pure water, and IPA liquid were supplied in this order to clean a wafer W, and then the spin drying operation was carried out. As a result, as shown in FIG. 6A, no water marks were observed on the surface of the wafer W. In order to evaluate generation of watermarks, square areas each having a size of 1 cm by 1 cm were selected on a wafer of 6 inches, as shown in FIG. 6A, and observed by eyes through a microscope of 150 magnifications, so as to count the number of water marks.

Figure 6B:
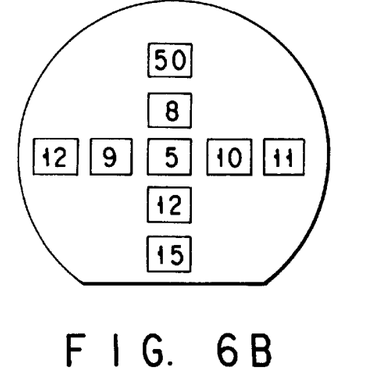
Figure 6C:
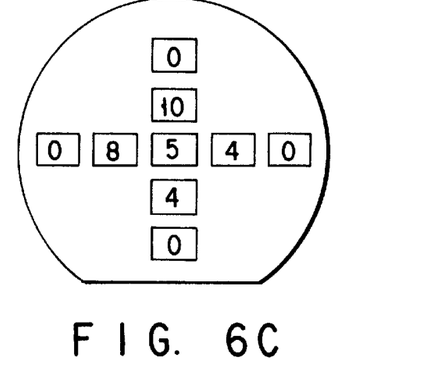

As comparative examples, the same evaluations were carried out, in a case where no IPA was supplied in the above described method, and also in a case where $N_2$ gas was sprayed, in place of the IPA liquid, onto the wafer W to accelerate removal of the pure water, in the above described method. The results of the comparative examples are shown in FIGS. 6B and 6C. Where the $N_2$ was sprayed (FIG. 6C), water marks were observed to some extent, though the number of the water marks were reduced, as compared to the case of no $N_2$ being used (FIG. 6A). In contrast, in the method according to the present invention (FIG. 6A), no water marks were observed. With these results, it has been found that the method according to the present invention is effective to prevent water marks from being generated.

The following experiment was conducted to confirm a relationship between generation rate of water marks and conditions in replacement and removal of the pure water with the IPA liquid. In this experiment, the distance between the tip opening of the replacing medium nozzle 8 and the surface of the wafer W, i.e., the height NH (cm) of nozzle 8, the inner diameter ID (mm) of the nozzle 8, and the flow speed SS (cm/sec) of the IPA liquid were used as parameters. While the IPA liquid was supplied through the nozzle 8, the wafer W was rotated at 80 rpm. During the spin drying operation, the following Drying Condition (DC) 1 was used.

Drying Condition 1: after supplying the IPA liquid, rotating the wafer W at 300 rpm for one second, and then at 3000 rpm for nineteen seconds.

Figure 7:
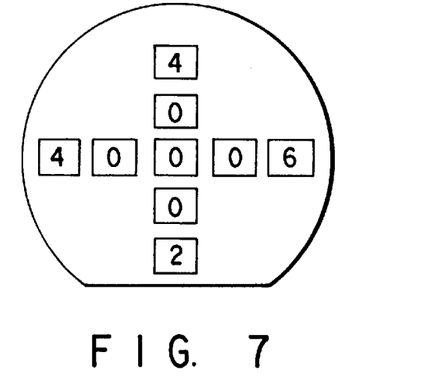
FIG. 7 is a view showing a water mark distribution.

Results of the experiment are shown in Table 1. In Table 1, water mark average (WMA) is defined by summing up the number of water marks in areas of water mark distribution (WM distribution) shown in FIG. 7, and then dividing the sum by the number of the areas. Symbols "A", "B", "C", and "D" shown in the column of evaluation EV stand for WMA values of "0", "2.5 or less", "5 or less", and "more than 5", respectively.

As shown in Table 1, where the inner diameter ID of the nozzle was 4 mm, the water mark average was low, as compared to the cases of 2 mm and 3 mm. With the results, it has been found that the inner diameter ID of the nozzle 8 should be set at 4 mm or more.

The water mark average became low, with a decrease in the height NH of the nozzle 8, such as 4.0 cm, 2.0 cm, and 1.0 cm. Where the height NH of the nozzle 8 was 2.0 cm, the water mark average was much lower than the case of 4.0 cm and having the same inner diameter ID of the nozzle 8. With the results, it has been found that the height NH of the nozzle 8 should be set at 2.0 cm or less.

Especially, in the cases where the height NH of the nozzle 8 was set at 2.0 cm or less, and the inner diameter ID of the nozzle 8 was set at 4 mm, the water mark average was zero. With the results, it has been found that the height NH and inner diameter ID of the nozzle 8 should be set at 2.0 cm or less, and at 4 mm or more.

Further, where the flow speed SS of the IPA liquid 80 was too large, the number of water marks was increased. As a result of additional experiments, it has been found that the flow speed SS should be set at 80 cm/sec or less.

TABLE 1

| NH (cm) | ID (mm) | SS (cm/sec) | DC | WMA | EV |
|---|---|---|---|---|---|
| 4.0 | 4 | 44 | 1 | 1.8 | B |
| 4.0 | 4 | 78 | 1 | 2.2 | B |
| 4.0 | 3 | 75 | 1 | 5.3 | D |
| 4.0 | 2 | 72 | 1 | 6.5 | D |
| 2.0 | 4 | 44 | 1 | 0 | A |
| 2.0 | 4 | 78 | 1 | 0 | A |
| 2.0 | 3 | 44 | 1 | 3.7 | C |
| 2.0 | 2 | 46 | 1 | 4.5 | C |
| 1.0 | 4 | 44 | 1 | 0 | A |
| 1.0 | 4 | 78 | 1 | 0 | A |
| 1.0 | 3 | 44 | 1 | 3.2 | C |
| 1.0 | 2 | 46 | 1 | 4.1 | C |
| 1.0 | 4 | 117 | 1 | 1.3 | B |

It is thought that water marks are prevented from being generated under the conditions described above on the following basis.

Figure 8A:
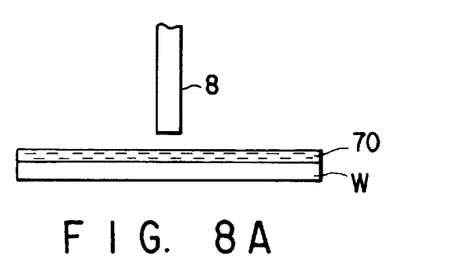
FIGS. 8A to 8C are views explaining Marangoni effect.
Figure 8B:
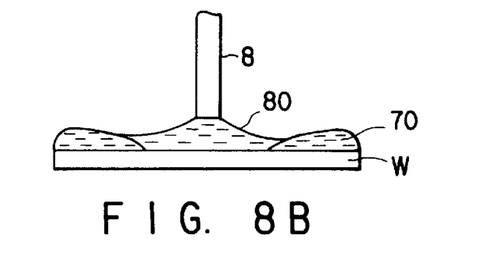

As shown in FIG. 8A, the IPA liquid 80 is supplied onto the pure water 70 which has been supplied on the wafer W in advance. Since pure water and IPA have different surface tensions, a phenomenon of so called Marangoni effect occurs when the IPA liquid 80 is supplied onto the pure water 70. Marangoni effect is an effect in that a liquid of a lower surface tension is attracted by a liquid of a higher surface tension. Namely, when the IPA liquid 80 is supplied onto the pure water 70, the IPA liquid 80, which has a lower surface tension, is attracted by the pure water 70, which has higher surface tension, as shown in FIG. 8B.

Figure 8C:
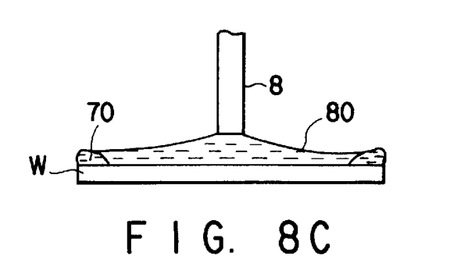

As the IPA liquid 80 is being supplied on the wafer W, the IPA liquid 80 is attracted by the pure water 70 and spreads in a concentric manner, as shown in FIG. 8C. The attracted IPA liquid is brought into contact with that part of the pure water which lies in patterns on the wafer W, and with water marks which have already been formed. As a result, the IPA liquid 80 is easily dissolved in the pure water 70 overall.

Where the height NH of the nozzle 8 is as small as 2.0 cm or less, and the inner diameter ID thereof is as large as 4 mm or more, the IPA liquid 80 can uniformly flow and spread from near the center of the wafer W in a concentric manner, thereby strengthening the Marangoni effect as described above. In contrast, if the height NH is larger and the inner diameter ID is smaller, it becomes difficult for the IPA liquid to uniformly spread in a concentric manner and to push out into the pure water 70 with a strong force. As a result, the IPA liquid 80 flows along with the pure water 70 in a mixed manner or flows on the surface of the pure water 70, thereby weakening the Marangoni effect.

Where the height NH of the nozzle 8 is small, there is an effect as follows. That is, the IPA liquid 80 moves a short distance from the spray port of the nozzle 8 to the surface of the wafer W, the IPA liquid 80 is brought into contact with oxygen and water in the atmosphere for a shorter period of time, as compared to a case where the height NH of the nozzle 8 is large. As a result, the amount of oxygen and water contained in the IPA liquid 80 causing water marks is decreased.

The following experiment was conducted to confirm a relationship between the generation rate of water marks and conditions in the spin drying operation. In this experiment, the IPA liquid was supplied onto a wafer W rotated at 80 rpm, while a nozzle height NH of 1.0 cm, a nozzle inner diameter ID of 4 mm, and a IPA flow speed SS of 44 cm/min were used, and then the spin drying operation was carried out. As a state in the spin drying operation, the following Drying Conditions (DC) 2 to 4 were used in addition to the above mentioned Drying Condition (DC) 1.

Drying Condition 2: after supplying the IPA liquid, rotating the wafer W at 300 rpm for one second, then at 1000 rpm for four seconds, and then at 3000 rpm for fifteen seconds.

Drying Condition 3: after supplying the IPA liquid, rotating the wafer W at 300 rpm for one second, then at 2000 rpm for four seconds, and then at 4000 rpm for fifteen seconds.

Drying Condition 4: after supplying the IPA liquid, rotating the wafer W at 300 rpm for one second, then at 3000 rpm for four seconds, and then at 5000 rpm for fifteen seconds.

Results of the experiment are shown in Table 2. As shown in Table 2, no water marks were observed in DCs 1, 3 and 4 except DC 2. On the other hand, where the wafer was rotated at 1000 rpm or more from the beginning just after the IPA liquid supply, the number of particles was increased due to splash back from the cup structure. With the results, it has been found that, after the IPA liquid supply, the wafer W should be rotated at a first rotation speed of 1000 rpm or less, and then at a second rotation speed of 2000 rpm or more, in order to prevent particles and water marks from being generated.

Where the wafer W is rotated at a high speed during the spin drying operation, removal of the IPA liquid is accelerated by a centrifugal force, and the wafer W is rapidly dried. As a result, the reaction shown in the above described reaction formula (1) hardly proceeds, so that less reaction product is produced. In addition the IPA liquid on the wafer is brought into contact with moisture in the atmosphere only for a short period of time, the moisture is not taken into the IPA liquid so much. It is thought that generation rate of water marks is lowered with these reasons.

As described above, where the rotation speed is too high at the beginning of the spin drying operation just after the IPA liquid supply, the pure water and IPA liquid scattered by a centrifugal force are splashed back onto the wafer W, and the number of adhered particles is increased. For this reason, it is preferable to initially rotate the wafer W at the first rotation speed to make big drops spun off, then at the second rotation speed to make small drops spun off.

A high speed rotation of the wafer is also effective to prevent water marks from being formed at those portions of the wafer W which correspond to the clamp fingers 38*a*.

Further, wafer clamping may be switched from the clamp fingers 38*a* to the clamp fingers 38*b* during the high speed rotation of the wafer W.

The following experiment was conducted to confirm a relationship between the generation rate of water marks and a supply period of time of the IPA liquid. In this experiment, a nozzle height NH of 1.0 cm, a nozzle inner diameter ID of 4 mm, and an IPA flow speed SS of 44 cm/min were used. With different supply periods of time ST (sec) of the IPA liquid, the IPA liquid was supplied onto a wafer W rotated at 80 rpm, and then the spin drying operation was carried out.

Results of the experiment are shown in Table 3. As shown in Table 3, no water marks were observed where the supply period of time ST was 3 seconds or more, while water marks were observed in the case of ST=2 (sec). With the results, it has been found that the supply period of time ST should be set at 3 sec or more, where the nozzle height NH is 1.0 cm, and the nozzle inner diameter ID is 4 mm or more. It is thought that if the supply period of time ST is too short, the IPA liquid cannot spread out in a concentric manner, thereby lowering replacement of the pure water with the IPA liquid by means of the Marangoni effect.

TABLE 2

| NH (cm) | ID (mm) | SS (cm/sec) | DC | WMA | EV |
| --- | --- | --- | --- | --- | --- |
| 1.0 | 4 | 44 | 1 | 0 | A |
| 1.0 | 4 | 44 | 2 | 1.1 | B |
| 1.0 | 4 | 44 | 3 | 0 | A |
| 1.0 | 4 | 44 | 4 | 0 | A |

TABLE 3

| ST (sec) | NH (cm) | ID (mm) | SS (cm/sec) | DC | WMA | EV |
| --- | --- | --- | --- | --- | --- | --- |
| 10 | 1.0 | 4 | 44 | 1 | 0 | A |
| 5 | 1.0 | 4 | 44 | 1 | 0 | A |
| 3 | 1.0 | 4 | 44 | 1 | 0 | A |
| 2 | 1.0 | 4 | 44 | 1 | 2.4 | B |

A spin cleaning method in the cleaning apparatus 29 will be described, in a case where pure water and an IPA vapor are used as the rinsing liquid and replacing medium, respectively.

At first, the chemical liquid nozzle 6 is placed on its supply position, and natural oxide films on the surface of a wafer W are removed with a hydrofluoric acid solution 60, as shown in FIG. 5A. The hydrofluoric acid solution spun off the surface of the wafer W is sucked by the inner cup 4 through the receiving opening 41, and is collected through the drain pipe 42.

Then, the chemical liquid nozzle 6 is retreated, and the rinsing nozzle 7 and replacing medium nozzle 8 are swung to their supply positions where their tips face the center of the wafer W. The valve 74 is opened and a rinsing liquid, such as pure water 70 is supplied from the nozzle 7 onto the surface of the wafer W near its center, as shown in FIG. 5B, so that the surface of the wafer is rinsed. The pure water 70 is supplied, e.g, at 1000 ml/min for one minute. The pure water spun off the surface of the wafer W is sucked by the outer cup 5 through the receiving opening 51, and is collected through the drain pipe 52.

Before the supply of the pure water 70 is stopped, i.e., the valve 74 is closed, such as two or three seconds before that, the valve 84 is opened and an IPA vapor 80 used as the replacing medium is supplied from the nozzle 8 onto the surface of the wafer W near its center, as shown in FIG. 5C, so that the rinsing liquid is replaced. The IPA vapor 80 is supplied, e.g, at 1000 ml/min for ten seconds.

When the pure water 70 and IPA vapor 80 are supplied, it is preferable to satisfy a temperature condition, i.e, "room temperature≦temperature of the pure water≦temperature of the IPA vapor". For example, the pure water 70 and IPA vapor 80 are supplied at about 30° C. and about 80° C., respectively, where the room temperature is 20° C. The temperature of the pure water 70 essentially decides the temperature of the wafer W at the time when the IPA vapor 80 is supplied. By adjusting the temperature condition, it is possible to control condensation and adsorption of the IPA vapor on the surface of the wafer W.

The wafer W is rotated at 300 rpm during the supply of the hydrofluoric acid solution, pure water, and IPA vapor. After the supply of the IPA vapor is stopped, the wafer W is rotated, e.g., at 300 rpm for one second, then at 3000 rpm for four seconds, and then at 5000 rpm for five seconds. Exhaustion of the process chamber 2 may be increased in synchronism with the rotation being switched to 3000 rpm. By doing so, the IPA vapor is removed, as shown in FIG. 5D. These sequential operations are conducted on the basis of a program stored in the control section 9.

It is preferable that wafer clamping is switched from the clamp fingers 38a to the clamp fingers 38b when the rotation is switched from a low speed rotation of 300 rpm to a high speed rotation of 3000 rpm to 5000 rpm, or during the high speed rotation of 3000 rpm to 5000 rpm. With this operation, water marks are hardly formed at those portions of the wafer W which correspond to the clamp fingers 38a. The pressure of the processing chamber 2 may be reduced to a vacuum, preferably to a vapor pressure of the replacing medium at the temperature of the wafer W (60 mmHg at 30° C. for IPA), after the pure water 70 is replaced by the IPA vapor 80. An inactive gas, such as $N_2$ may be sprayed onto the surface of the wafer W during the spin drying operation. With these auxiliary operations, the replacing medium can be removed for a shorter period of time.

As the IPA vapor, it is possible to use an IPA vapor having a temperature of about its boiling point, which is obtained by heating an IPA liquid to be saturated. It is also possible to use a mixture of such an IPA vapor and a diluting $N_2$, having a temperature of from a room temperature to a boiling point.

Where the temperature of the surfaces of the wafer W and pure water is sufficiently low, the IPA vapor brought into contact with these surfaces is cooled and part of the vapor beyond its saturation vapor amount is condensed. On the other hand, where the temperature of the surfaces of the wafer W and pure water is sufficiently high, e.g., higher than the IPA boiling point, the IPA vapor brought into contact with these surfaces is adsorbed on the surfaces. In this state, the IPA vapor supplied onto the wafer W and dissolved in water on the wafer W demonstrates the Marangoni effect, so that the pure water is replaced with the IPA vapor and removed from the wafer W. The temperature of the surface of the wafer W can be controlled by adjusting the temperature of the pure water supplied before the IPA vapor.

Figure 9A:
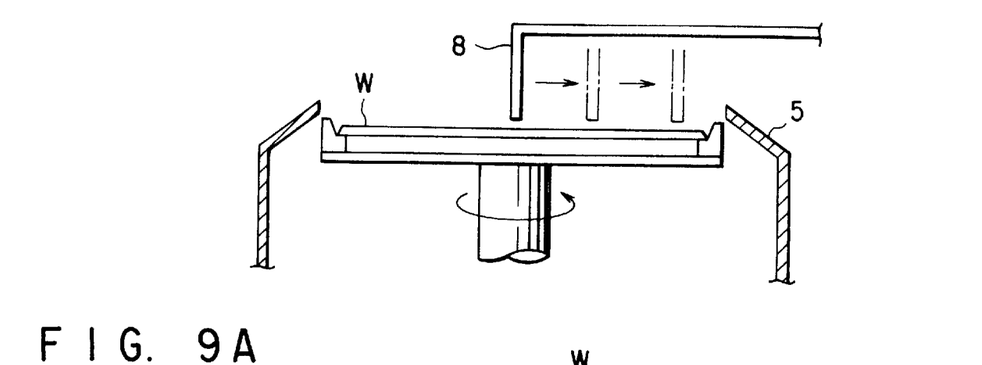
FIGS. 9A and 9B are side and plan views, respectively, schematically showing a main part of a modification of the cleaning apparatus.
Figure 9B:
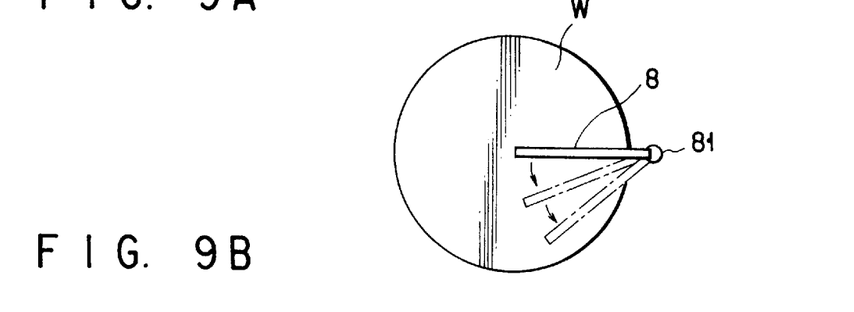

The IPA vapor is obtained by vaporizing an IPA liquid, and removing particles, substances of a high boiling point, metallic contaminants, and the like contained in the IPA liquid, so that purity of the IPA vapor is higher than that of the IPA liquid. In other words, less amount of moisture and impurities are carried over onto the wafer W by the IPA vapor, as compared to an IPA liquid, thereby preventing water marks from being generated.

Where an IPA vapor is used, it is important to allow the vapor to uniformly spread on the wafer W. FIGS. 9A and 9B are side and plan views, respectively, schematically showing a main part of a modification of the cleaning apparatus, which is improved to allow the IPA vapor to uniformly spread on the wafer W.

In the cleaning apparatus shown in FIGS. 9A and 9B, the replacing medium nozzle 8 is designed to move above the wafer W during the supply of the IPA vapor. For example, while the wafer W is rotated at 30 rpm and the IPA vapor is supplied from the nozzle 8, the wafer W is scanned by the nozzle 8 moving outward from the center of the wafer W in a radial direction. By doing so, the IPA vapor can be diffused all over the top surface of the wafer W.

Figure 10A:
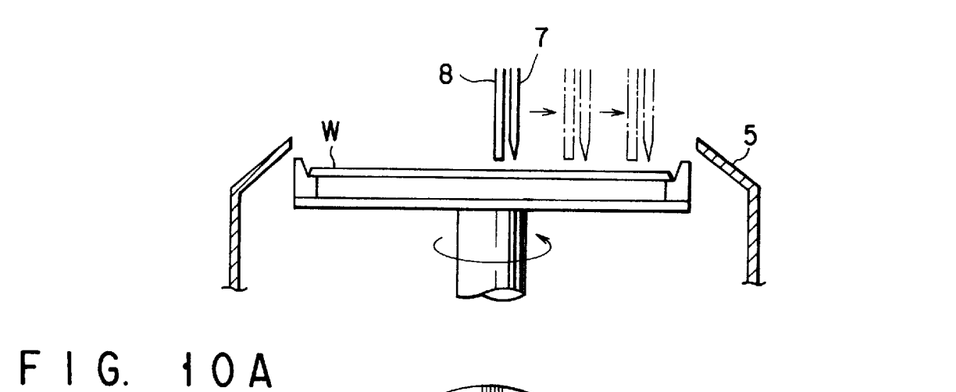
FIGS. 10A and 10B are side and plan views, respectively, schematically showing a main part of another modification of the cleaning apparatus.
Figure 10B:
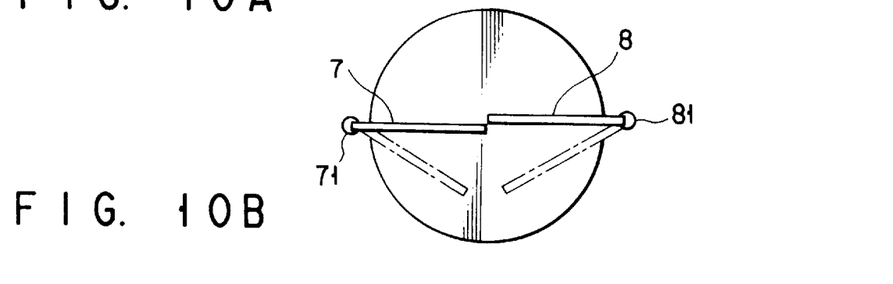

FIGS. 10A and 10B are side and plan views, respectively, schematically showing a main part of another modification of the cleaning apparatus, which is improved to allow the IPA vapor to uniformly spread on the wafer W.

In the cleaning apparatus shown in FIGS. 10A and 10B, the rotation shafts 71 and 81 of the rinsing nozzle 7 and replacing medium nozzle 8 are arranged one on either side of the wafer. The nozzles 7 and 8 are moved outward from the center of the wafer W to scan it, with the nozzle 7 going ahead of the nozzle 8, so that the pure water and IPA vapor are essentially simultaneously supplied. By doing so, the pure water supplied on the wafer W is immediately removed by the IPA vapor, thereby effectively preventing water marks from being generated.

The rotation of the wafer W may be stopped while the replacing medium nozzle 8 scans in the cleaning apparatuses shown in FIGS. 9A to 10B.

Figure 11:
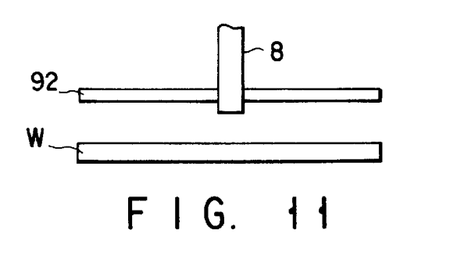
FIG. 11 is a side view schematically showing a main part of still another modification of the cleaning apparatus.

FIG. 11 is a side view schematically showing a main part of still another modification of the cleaning apparatus, which is improved to allow the IPA vapor to uniformly spread on the wafer W.

In the cleaning apparatus shown in FIG. 11, a circular rectifying plate 92 is attached to the distal portion of the replacing medium nozzle 8. The rectifying plate 92 has a diameter essentially the same as that of the wafer W, and arranged to be centered with the wafer W. The distance between the wafer W and rectifying plate 92 is set at about 5 mm. With this arrangement, the IPA vapor spreads along the rectifying plate 92, so that the IPA vapor is diffused all over the wafer W up to its edge. In addition, the wafer W is rotated during the supply of the IPA vapor, the IPA vapor is more uniformly diffused on the wafer.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A spin cleaning method comprising:
    an attaching step of attaching a target substrate having a surface to a rotatable spin chuck having a plurality of first clamp fingers to engage with a side of the substrate and fix the substrate;
    a chemical liquid treatment step of supplying a chemical liquid onto the surface of the substrate while rotating the substrate, after the attaching step;

a rinsing step of supplying a rinsing liquid onto the surface of the substrate while rotating the substrate, after the chemical liquid treatment step;

a replacing step of supplying a replacing medium liquid onto a substantial center of the surface of the substrate from above, and replacing the rinsing liquid with the replacing medium liquid on the surface of the substrate, the replacing medium liquid being mixable with the rinsing liquid and having a degree of surface tension lower than that of the rinsing liquid, supply of the replacing medium liquid being started before supply of the rinsing liquid is stopped, the substrate being rotated during the replacing step; and a removing step of removing the replacing liquid on the surface of the substrate by a centrifugal force which is generated by rotating the substrate.

2. The spin cleaning method according to claim 1, further comprising a chemical liquid treatment step of supplying a chemical liquid onto the surface of the substrate while rotating the substrate, before the rinsing step.

3. The spin cleaning method according to claim 1, wherein the replacing medium liquid has a vapor pressure of 10 mmHg to 200 mmHg at 20° C.

4. The spin cleaning method according to claim 1, wherein supply of the replacing liquid is started before supply of the rinsing liquid is stopped.

5. The spin cleaning method according to claim 1, wherein the substrate is rotated during the replacing step.

6. The spin cleaning method according to claim 1, wherein the substrate is held and rotated by a spin chuck, which has a plurality of first clamp fingers to engage with a side of the substrate and fix the substrate.

7. The spin cleaning method according to claim 6, wherein the substrate is rotated first at a first rotation speed of 1000 rpm or less and then at a second rotation speed of 2000 rpm or more in the removing step.

8. The spin cleaning method according to claim 7, wherein the spin chuck has a plurality of second clamp fingers to engage with a side of the substrate and fix the substrate, the substrate being fixed first by the first clamp fingers and then by the second clamp fingers in the removing step.

9. The spin cleaning method according to claim 1, wherein the replacing medium liquid is supplied onto the surface of the substrate from a supply port having an inner diameter of 4 mm or more.

10. The spin cleaning method according to claim 1, wherein the replacing medium liquid is supplied at a flow speed of 80 cm/sec or less.

11. The spin cleaning method according to claim 1, wherein $N_2$ gas is sprayed onto the surface of the substrate in the removing step.

12. A spin cleaning method comprising:

an attaching step of attaching a target substrate having a surface to a rotatable spin chuck having a plurality of first clamp fingers to engage with a side of the substrate and fix the substrate;

a chemical liquid treatment step of supplying a chemical liquid onto the surface of the substrate while rotating the substrate, after the attaching step;

a rinsing step of supplying a rinsing liquid onto the surface of the substrate while rotating the substrate, after the chemical liquid treatment step;

a replacing step of supplying a replacing medium vapor onto a substantial center of the surface of the substrate from above and under such conditions as to substantially maintain the replacing medium vapor in a vapor state, and replacing the rinsing liquid with the replacing medium vapor on the surface of the substrate, the replacing medium vapor being mixable with the rinsing liquid and having a degree of surface tension lower than that of the rinsing liquid, supply of the replacing medium vapor being started before supply of the rinsing liquid is stopped and while the substrate is being rotated, the substrate being rotated during the replacing step, the replacing medium vapor being supplied from a supply port which is moved above the substrate and scans the substrate radially outward from the substantial center of the surface in the replacing step; and a removing step of removing the replacing liquid on the surface of the substrate by a centrifugal force which is generated by rotating the substrate.

13. The spin cleaning method according to claim 12, further comprising a chemical liquid treatment step of supplying a chemical liquid onto the surface of the substrate while rotating the substrate, before the rinsing step.

14. The spin cleaning method according to claim 12, wherein the replacing medium vapor has a vapor pressure of 10 mmHg to 200 mmHg at 20° C.

15. The spin cleaning method according to. claim 12, wherein supply of the replacing liquid is started before supply of the rinsing liquid is stopped.

16. The spin cleaning method according to claim 12, wherein the substrate is rotated during the replacing step.

17. The spin cleaning method according to claim 12, wherein the substrate is held and rotated by a spin chuck, which has a plurality of first clamp fingers to engage with a side of the substrate and fix the substrate.

18. The spin cleaning method according to claim 17, wherein the substrate is rotated first at a first rotation speed of 1000 rpm or less and then at a second rotation speed of 2000 rpm or more in the removing step.

19. The spin cleaning method according to claim 18, wherein the spin chuck has a plurality of second clamp fingers to engage with a side of the substrate and fix the substrate, the substrate being fixed first by the first clamp fingers and then by the second clamp fingers in the removing step.

20. The spin cleaning method according to claim 12, wherein the replacing medium vapor is supplied from a supply port which is moved above the substrate and scan the substrate in the replacing step.

21. The spin cleaning method according to claim 12, wherein the rinsing liquid and replacing medium vapor are supplied from supply ports which are substantially simultaneously moved above the substrate and scan the substrate in the replacing step, while the supply port of the rinsing liquid goes ahead of the supply port of the replacing medium vapor, so that the rinsing and replacing steps are performed substantially in parallel with each other.

22. The spin cleaning method according to claim 12, wherein the replacing medium is diffused along a rectifying plate, which is placed to face the substrate substantially all over the substrate with a small gap therebetween, during the replacing step.

23. The spin cleaning method according to claim 12, wherein $N_2$ gas is sprayed onto the surface of the substrate in the removing step.

* * * * *